(12) United States Patent
Liu

(10) Patent No.: US 9,445,505 B2
(45) Date of Patent: Sep. 13, 2016

(54) ROTARY CONVEYING EQUIPMENT FOR EXPOSING SUBSTRATE

(71) Applicant: APONE TECHNOLOGY LTD., Taoyuan County (TW)

(72) Inventor: Wei-Lin Liu, Taoyuan County (TW)

(*) Notice: Subject to any disclaimer, the term of this patent is extended or adjusted under 35 U.S.C. 154(b) by 295 days.

(21) Appl. No.: 13/658,169

(22) Filed: Oct. 23, 2012

(65) Prior Publication Data

US 2014/0015183 A1    Jan. 16, 2014

(30) Foreign Application Priority Data

Jul. 13, 2012    (TW) .............................. 101125310 A

(51) Int. Cl.
*B23Q 1/25* (2006.01)
*H05K 3/00* (2006.01)

(52) U.S. Cl.
CPC .......... *H05K 3/0082* (2013.01); *H05K 3/0097* (2013.01); *H05K 2203/0165* (2013.01); *H05K 2203/1545* (2013.01); *H05K 2203/1554* (2013.01)

(58) Field of Classification Search
CPC ........ B65H 5/00; B65H 5/021; B65H 29/00; B65H 29/16; H05K 3/0082; H05K 2203/1545; H05K 2203/1554; B25H 1/0007; B25H 1/0042

USPC ............. 269/9, 37–45, 55–57, 71, 903; 198/349.3, 457.07, 598; 414/935; 271/306, 198

See application file for complete search history.

(56) References Cited

U.S. PATENT DOCUMENTS

| | | | | |
|---|---|---|---|---|
| 4,756,429 A | * | 7/1988 | Lehman et al. | 211/43 |
| 5,599,183 A | * | 2/1997 | Razdolsky et al. | 433/53 |
| 8,328,173 B1 | * | 12/2012 | DesForge et al. | 269/71 |
| 2009/0065373 A1 | * | 3/2009 | Kornowski | 206/6.1 |
| 2010/0213147 A1 | * | 8/2010 | Hopper et al. | 211/62 |
| 2012/0145080 A1 | * | 6/2012 | Park | C23C 16/4412 118/725 |
| 2012/0240458 A1 | * | 9/2012 | Ganske | 47/39 |
| 2013/0168342 A1 | * | 7/2013 | Yatscoff | 211/85.2 |

FOREIGN PATENT DOCUMENTS

WO    WO 2010094345 A1 *  8/2010  .......... B41F 15/0818

* cited by examiner

*Primary Examiner* — Monica Carter
*Assistant Examiner* — Nirvana Deonauth
(74) *Attorney, Agent, or Firm* — Meagher Emanuel Laks Goldberg & Liao, LLP

(57) ABSTRACT

Disclosed is a rotary conveying equipment for exposing a substrate. The rotary conveying equipment includes a carrying device and a rotary moving device. The carrying device carries the substrate by fastening the substrate thereon. The rotary moving device includes a rotating means, and the rotating means is connected to the carrying device and is moved together while rotated. And the efficiency of the exposure process is improved.

10 Claims, 3 Drawing Sheets

ROTARY CONVEYING EQUIPMENT FOR EXPOSING SUBSTRATE

FIELD OF THE INVENTION

The present invention relates to an exposure equipment, and more particularly to a rotary conveying equipment for exposing a substrate.

BACKGROUND OF THE INVENTION

An electronic circuit used in an electronics device such as a liquid crystal display (LCD), a printed circuit board (PCB) and a wireless charger is patterned with a circuit on its substrate by the steps of: designing a pattern of circuit; spreading photoresists; aiming; exposing to light; etching; removing photoresist; and detecting. During exposure, the substrate is usually exposed by light from a light source (e.g. arc mercury lamp).

However, in a known manner, when the substrate is exposed to light by the conventional exposure equipment (aligner), it needs the exposing step that sequentially overturns the surfaces of the substrates to expose to light. Hence, the exposing step is so complicated that the time of the process is increased.

SUMMARY OF THE INVENTION

The present invention is to overcome the above mentioned problems of the conventional exposure equipment by providing a rotary conveying equipment for exposing a substrate.

A rotary conveying equipment for exposing a substrate of the present invention comprises: a carrying device carrying the substrate by fastening the substrate thereon; and a rotary moving device including a rotating means and a transporting means, wherein the rotating means on which the carrying device is disposed is fastened on the transporting means, and the rotating means is transported by the transporting means along an exposure path where the substrate carried by the carrying device is exposed by the exposure light of a light exposure device, and the rotating means is provided for rotating the carrying device around a rotation axis which moves along the exposure path, and the light exposure device for emitting the exposure light to the substrate fastened by the carrying device along the exposure path while the carrying device is transported by the transporting means and rotated by the rotating means along the exposure path to enable the carrying device to pass through the light exposure device, wherein the light exposure device is provided separately from the carrying device and the rotary moving device by being provided on a side of the exposure path, in which a direction of the exposure light is perpendicular to the exposure path along which the transporting means moves the rotating means, wherein the carrying device is transported by the transporting means along the exposure path while the carrying device is rotated by the rotating means along the exposure path in such a manner that the substrate fastened on the carrying device is rotated around the rotation axis while the substrate is transported along the exposure path and is exposed by the light exposure device along the exposure path.

In a preferred embodiment of the present invention, the rotating means is a supporting shaft rotating around an axial direction thereof.

In a preferred embodiment of the present invention, the rotating means is parallel to a longitudinal surface of the carrying device.

In a preferred embodiment of the present invention, a rotation axis of the rotating means passes through the center of the carrying device.

In a preferred embodiment of the present invention, a distance between a rotation axis of the rotating means and a center of the carrying device is a half length of a transverse surface of the carrying device.

In a preferred embodiment of the present invention, a distance between a rotation axis of the rotating means and the center of the carrying device is longer than a half length of a transverse surface of the carrying device.

In a preferred embodiment of the present invention, the rotary conveying equipment further comprises an extending member, connected between the rotating means and the carrying device.

In a preferred embodiment of the present invention, a plurality of the carrying devices is provided to connect with the rotating means through the extending members.

In a preferred embodiment of the present invention, an extension direction of the extending member is parallel to a transverse surface of the carrying device.

In a preferred embodiment of the present invention, a rotation axis of the extending member is provided along an extension direction.

By means of technical means of this present invention, the surfaces of the substrates are all exposed to exposure light by the rotary conveying equipment according to the present invention without turning the substrate over sequentially, and thus the time of the process is reduced and the operation steps are simplified to improve the efficiency of the exposure process.

BRIEF DESCRIPTION OF THE DRAWINGS

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The First Embodiment

Figure 1:
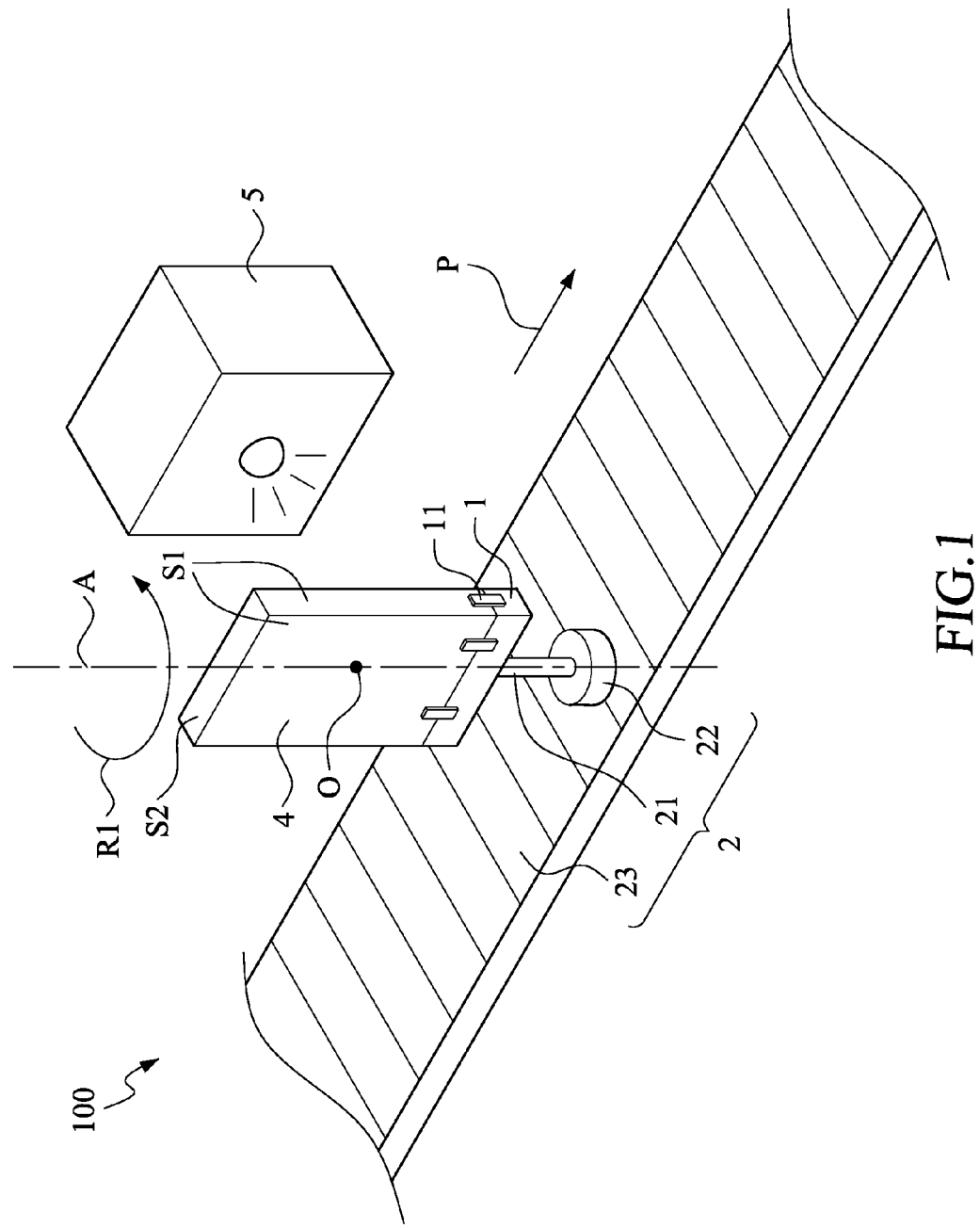
FIG. 1 is a schematic diagram illustrating the first embodiment according to the present invention.

A rotary conveying equipment 100 of the present invention is shown in FIG. 1. FIG. 1 is a schematic diagram illustrating the first embodiment according to the present invention. In this embodiment, the rotary conveying equipment 100 includes a carrying device 1 and a rotary moving device 2.

The carrying device 1 is provided to carry the substrate 4 thereon. The carrying device 1 includes a fastening member 11 for fastening the substrate 4. In the embodiment, the carrying device 1 is a platform and the fastening member 11 is a tong.

The rotary moving device 2 includes a rotating means 21, a driving means 22, and a transporting means 23. The rotating means 21 is connected with the carrying device 1. In this embodiment, the rotating means 21 is a supporting shaft, and is moved while rotated. Of course, the embodiment is not to limit the present invention. The rotating means 21 may be a rotation disk in order that the carrying device 1 can be rotated.

In this embodiment, the rotating means 21 is parallel to the longitudinal surface S1 of the substrate 4 and a longitudinal surface of the carrying device 1, and the rotation axis A of the rotating means 21 passes through the center O of the substrate 4 and a center of the carrying device 1.

The driving means 22 is connected with an end of the rotating means 21 and drives the rotating means 21 to rotate, wherein the rotational axis of the rotating means 21 is provided along the rotation axis A. The transporting means 23 is connected with the driving means 22 for moving the driving means 22 to simultaneously move the rotating means 21 in an exposure path P. In this embodiment, the driving means 22 is a motor and the transporting means 23 is a conveyer. However, the embodiment is not to limit the present invention but allows one means (e.g. mechanical arm), which is integrally formed, be provided to rotate the rotating means 21 and to move the rotating means 21 along the exposure path P.

A light exposure device 5 is provided on the side of the exposure path P for exposing the substrate 4 to light.

By the structure described above, as the driving means 22 is transported by the transporting means 23, it thus make the rotating means 21, the carrying device 1 and the substrate 4 fastened on the carrying device 1 all move along the exposure path P. The substrate 4 is exposed by the light exposure device 5 while it moves along the exposure path P.

Because the rotating means 21 is rotating on a rotary axis extending from the rotation axis A by the driving means 22, therefore the substrate 4 fastened on the carrying device 1 is also rotated by the rotating means 21. In this embodiment, a rotating direction R1 of the rotating means 21 is counterclockwise. However, the embodiment is not to limit the present invention, the rotating direction R1 of the rotating means 21 may be clockwise.

When the substrate 4 is rotating, each longitudinal surface S1 of the substrate 4 is exposed by the exposure light emitted from the light exposure device 5. This causes that each longitudinal surface S1 of the substrate 4 are exposed to exposure light during one exposure process.

The Second Embodiment

Figure 2:
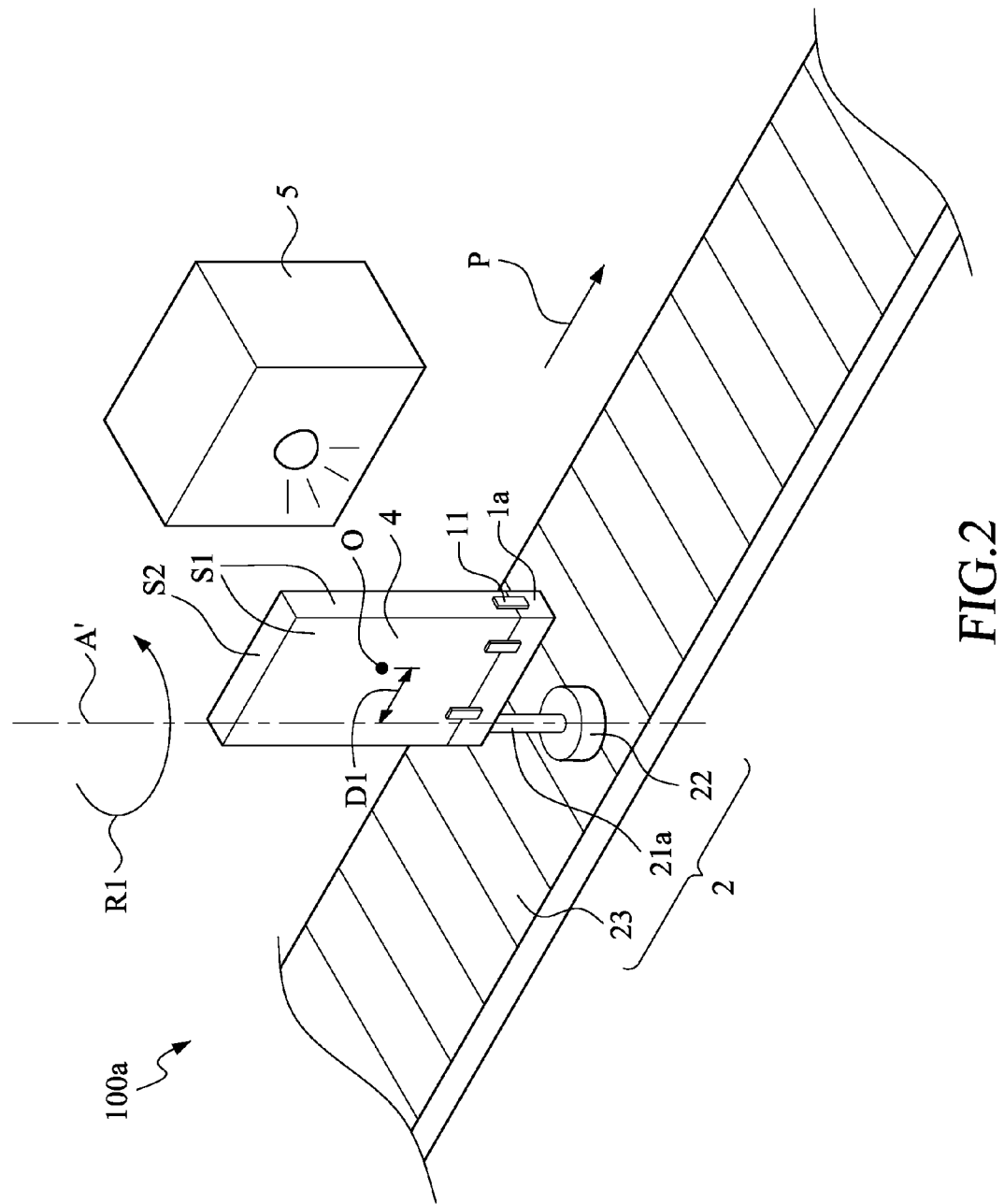
FIG. 2 is a schematic diagram illustrating the second embodiment according to the present invention.

Refer to FIG. 2. FIG. 2 is a schematic diagram illustrating the second embodiment according to the present invention. The composition elements of the rotary conveying equipment 100a are the same as the first embodiment. Same elements are labeled with the same reference numbers for corresponding description. The difference is that a distance D1 between a rotation axis A' of the rotating means 21a and a center O of the substrate 4, which equals to the rotation axis A' of the rotating means 21a and a center of the carrying device 1, is a half length of a transverse surface S2 of the substrate 4 and a half length of a transverse surface of the carrying device 1. Thus, the substrate 4 fastened on the carrying device 1a is rotated by the rotating means 21a with a rotation radius, and the rotation radius is different from the above described the first embodiment for the different case. Other structures are the same as that of the first embodiment so they are not repeated herein.

The Third Embodiment

Figure 3:
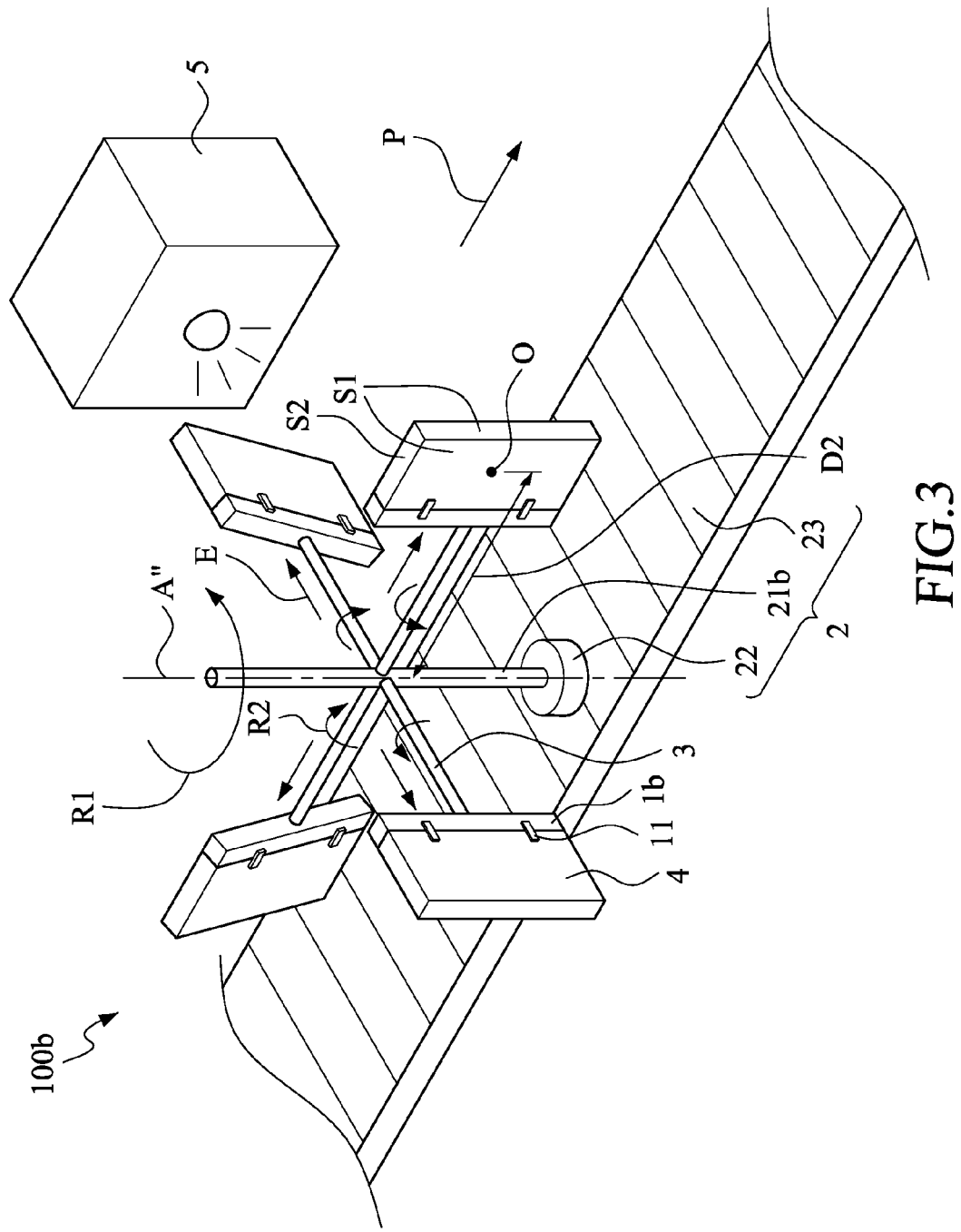
FIG. 3 is a schematic diagram illustrating the third embodiment according to the present invention.

Refer to FIG. 3. FIG. 3 is a schematic diagram illustrating the third embodiment according to the present invention. The composition elements of the rotary conveying equipment 100b are the same as the first embodiment. Same elements are labeled with the same reference numbers for corresponding description. The difference is that the rotary conveying equipment 100b includes four carrying devices 1b and four extending members 3. Each carrying device 1b is thus connected to the rotating means 21b with each extending member 3. However the embodiment is not to limit the present invention, the rotary conveying equipment also can include one or more carrying devices and one or more extending members in order that each carrying device is connected to the rotating means with each extending member.

In this embodiment, a distance D2 between a rotation axis A" of the rotating means 21b and the center O of the substrate 4, which equals to a distance between the rotation axis A" of the rotating means 21b and the center of the carrying device 1, is longer than a half length of a transverse surface S2 of the substrate 4 and longer than a half length of a transverse surface of the carrying device 1.

In this embodiment, the extending member 3 is connected between the rotating means 21b and the carrying device 1b. An extension direction E of the extending member 3 is parallel to a transverse surface S2 of the substrate 4 and perpendicular to the rotation axis A" of the rotating means 21b. However the embodiment is not to limit the present invention, the extension direction E of the extending member 3 is not parallel to the transverse surface S2 of the substrate 4 and not perpendicular to the rotating means 21b.

In this embodiment, the extending member 3 is rotating around the extending direction E by a driving means (not shown in figure). The rotating direction R2 of the extending member 3 is counterclockwise. However, the embodiment is not to limit the present invention, the rotating direction R2 of the extending member 3 may be clockwise.

Therefore, each carrying device 1b, which is respectively rotated around the rotating direction of each extending member 3, revolves around the rotation axis A" of the rotating means 21b with the rotating means 21b, wherein the rotation axis A" of the rotating means 21b is the revolution axis. By the means mentioned above, surfaces of the substrate 4 fastened on the carrying device 1b are exposed to exposure light, so that surfaces of four substrates fastened on the carrying device are all exposed to exposure light.

As can be appreciated from the embodiments according to the present invention, the surfaces of the substrates are all exposed to exposure light by the rotary conveying equipment according to the present invention without overturning the substrate sequentially. By above-mentioned means, the time of the process is reduced and the operation steps are simplified in order to improve the efficiency of the exposure process.

The above description should be considered as only the discussion of the preferred embodiments of the present invention. However, a person skilled in the art may make various modifications to the present invention. Those modifications still fall within the spirit and scope defined by the appended claims.

What is claimed is:

1. A rotary conveying equipment for exposing a substrate, comprising:
   a carrying device carrying the substrate by fastening the substrate on the carrying device;
   a rotary moving device including a rotating means and a transporting means, wherein the rotating means on which the carrying device is disposed is fastened on the transporting means, and the rotating means is transported by the transporting means along an exposure path where the substrate carried by the carrying device is exposed by the exposure light of a light exposure device, and the rotating means is provided for rotating the carrying device around a rotation axis which moves along the exposure path; and the light exposure device for emitting the exposure light to the substrate fastened by the carrying device along the exposure path while the carrying device is transported by the transporting means and rotated by the rotating means along the exposure path to enable the carrying device to pass through the light exposure device, wherein the light exposure device is provided separately from the carrying device and the rotary moving device by being provided on a side of the exposure path, in which a direction of the exposure light is perpendicular to the exposure path along which the transporting means moves the rotating means, wherein the carrying device is transported by the transporting means along the exposure path while the carrying device is rotated by the rotating means along the exposure path in such a manner that the substrate fastened on the carrying device is rotated around the rotation axis while the substrate is transported along the exposure path and is exposed by the light exposure device along the exposure path.

2. The rotary conveying equipment as claimed in claim 1, wherein the rotating means is a supporting shaft rotating on an axial direction of the supporting shaft.

3. The rotary conveying equipment as claimed in claim 1, wherein the rotating means is parallel to a longitudinal surface of the carrying device.

4. The rotary conveying equipment as claimed in claim 1, wherein the rotation axis of the rotating means passes through the center of the carrying device.

5. The rotary conveying equipment as claimed in claim 1, wherein a distance between the rotation axis of the rotating means and a center of the carrying device is a half length of a transverse surface of the carrying device.

6. The rotary conveying equipment as claimed in claim 1, wherein a distance between the rotation axis of the rotating means and the center of the carrying device is larger than a half length of a transverse surface of the carrying device.

7. The rotary conveying equipment as claimed in claim 1, further comprising at least one extending member, connected between the rotating means and the carrying device.

8. The rotary conveying equipment as claimed in claim 7, wherein a plurality of the carrying devices are provided for connecting the rotating means through the at least one extending member.

9. The rotary conveying equipment as claimed in claim 7, wherein an extension direction of the extending member is parallel to a transverse surface of the carrying device.

10. The rotary conveying equipment as claimed in claim 7, wherein the extending member is provided along an extension direction, wherein the extension direction is substantially perpendicular to the rotation axis of the rotating means.

* * * * *